(12) United States Patent
Theodosiou et al.

(10) Patent No.: US 10,978,291 B2
(45) Date of Patent: Apr. 13, 2021

(54) PRE-CLEANING A SEMICONDUCTOR STRUCTURE

(71) Applicant: SPTS TECHNOLOGIES LIMITED, Newport (GB)

(72) Inventors: Alex Theodosiou, Caerphilly (GB); Steve Burgess, Ebbw Vale Gwent (GB)

(73) Assignee: SPTS Technologies Limited, Newport (GB)

( * ) Notice: Subject to any disclaimer, the term of this patent is extended or adjusted under 35 U.S.C. 154(b) by 113 days.

(21) Appl. No.: 14/483,926

(22) Filed: Sep. 11, 2014

(65) Prior Publication Data
US 2015/0075973 A1 Mar. 19, 2015

(30) Foreign Application Priority Data
Sep. 16, 2013 (GB) ...................................... 1316446

(51) Int. Cl.
*H01L 21/02* (2006.01)
*H01L 21/768* (2006.01)
(Continued)

(52) U.S. Cl.
CPC .. *H01L 21/02046* (2013.01); *H01L 21/02063* (2013.01); *H01L 21/67017* (2013.01); *H01L 21/76814* (2013.01); *H01J 37/32* (2013.01)

(58) Field of Classification Search
None
See application file for complete search history.

(56) References Cited

U.S. PATENT DOCUMENTS

| 4,357,203 A | 11/1982 | Zelez |
| 5,660,682 A | 8/1997 | Zhao et al. |

(Continued)

FOREIGN PATENT DOCUMENTS

| EP | 1050905 A2 | 11/2000 |
| JP | 9-251989 A | 9/1997 |

(Continued)

OTHER PUBLICATIONS

GB Search Report in related GB Application No. GB1316446.2 dated Jan. 30, 2014.

*Primary Examiner* — Mikhail Kornakov
*Assistant Examiner* — Ryan L. Coleman
(74) *Attorney, Agent, or Firm* — Hodgson Russ LLP

(57) ABSTRACT

The invention relates to a method of pre-cleaning a semiconductor structure and to associated modular semiconductor process tools. The method includes the steps of: (i) providing a semiconductor structure having an exposed dielectric layer of an organic dielectric material, wherein the dielectric layer has one or more features formed therein which expose one or more electrically conductive structures to be pre-cleaned, in which the electrically conductive structures each include a metal layer, optionally with a barrier layer formed thereon, and the surface area of the exposed dielectric layer is greater than the surface area of the electrically conductive structures exposed by the dielectric layer; and (ii) pre-cleaning the semiconductor structure by performing an Ar/H2 sputter etch to remove material from the exposed electrically conductive structures and to remove organic dielectric material from the exposed dielectric layer.

10 Claims, 5 Drawing Sheets

(51) Int. Cl.
*H01L 21/67* (2006.01)
*H01J 37/32* (2006.01)

(56) References Cited

U.S. PATENT DOCUMENTS

| | | | | |
|---|---|---|---|---|
| 6,143,128 A | * | 11/2000 | Ameen | C23C 16/0227 |
| | | | | 118/719 |
| 6,492,272 B1 | * | 12/2002 | Okada | G03F 7/427 |
| | | | | 134/1.2 |
| 6,511,575 B1 | | 1/2003 | Shindo et al. | |
| 7,014,887 B1 | | 3/2006 | Cohen et al. | |
| 7,053,002 B2 | * | 5/2006 | Cohen | H01L 21/31116 |
| | | | | 134/1.1 |
| 2002/0050651 A1 | | 5/2002 | Nakagawa et al. | |
| 2002/0068458 A1 | * | 6/2002 | Chiang | C23C 16/0227 |
| | | | | 438/694 |
| 2003/0196760 A1 | * | 10/2003 | Tyler | H01J 37/32082 |
| | | | | 156/345.47 |
| 2004/0084318 A1 | * | 5/2004 | Cohen | C25D 5/08 |
| | | | | 205/98 |
| 2005/0272247 A1 | | 12/2005 | Ikeda et al. | |
| 2006/0231383 A1 | | 10/2006 | Mullapudi et al. | |
| 2008/0174029 A1 | | 7/2008 | Shim | |
| 2014/0196746 A1 | * | 7/2014 | Dinsmore | H01L 21/02063 |
| | | | | 134/1.1 |

FOREIGN PATENT DOCUMENTS

| | | |
|---|---|---|
| JP | 251989 | 9/1997 |
| JP | 2000-311940 A | 11/2000 |
| JP | 311940 | 11/2000 |
| JP | 2001-28371 A | 1/2001 |
| JP | 28371 | 1/2001 |
| JP | 134612 A | 5/2002 |
| JP | 2012-74608 A | 4/2012 |
| JP | 74608 | 4/2012 |
| KR | 100700392 | 3/2007 |
| TW | 465057 B | 11/2001 |
| WO | 2002/19418 A2 | 3/2002 |

* cited by examiner

Figure 1. Schematic representation of Hot Sputter Etch - pre-clean module

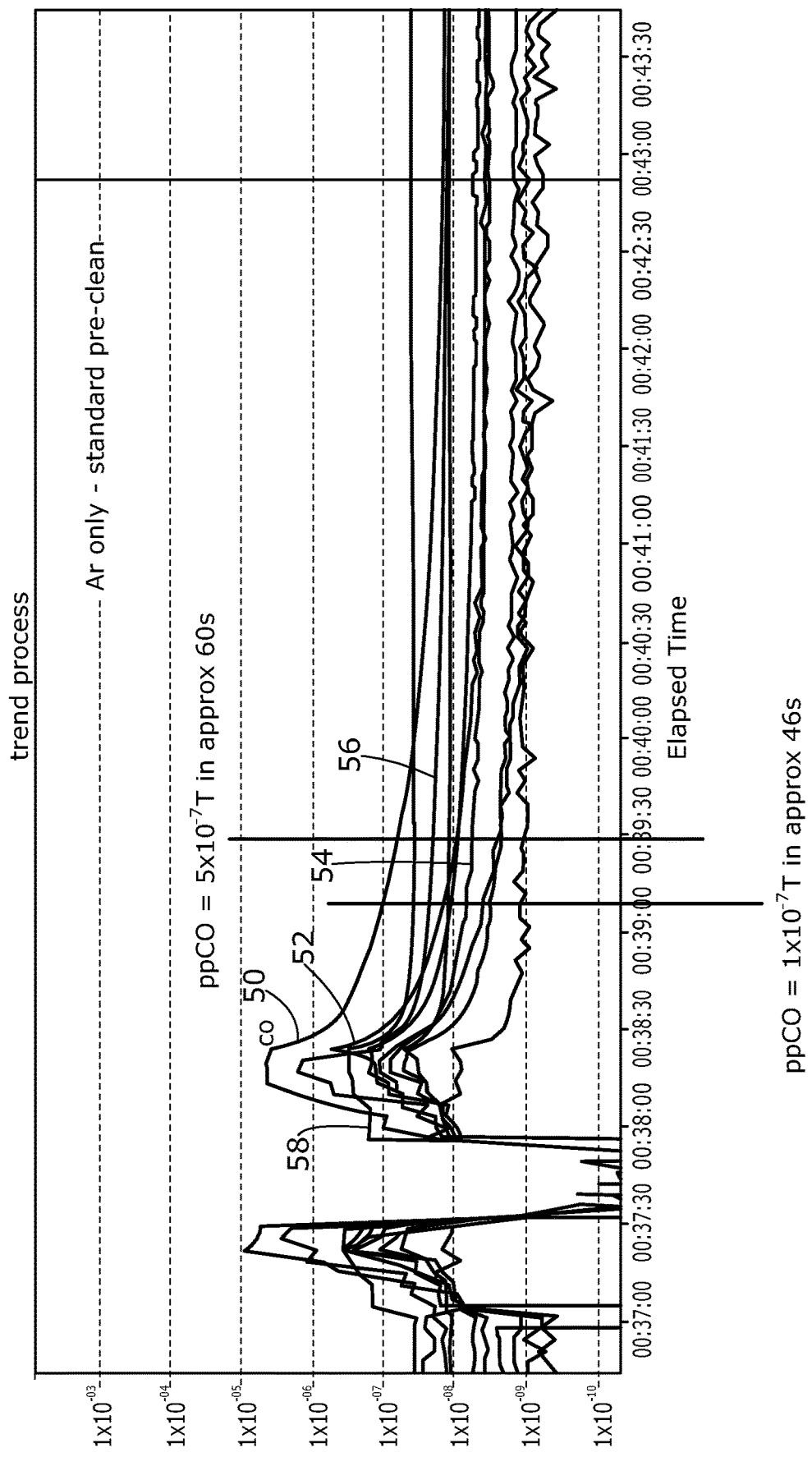
Figure 3  RGA Trace of PI wafer etched using a "standard" Ar only pre-clean. Total material removed = 200Å

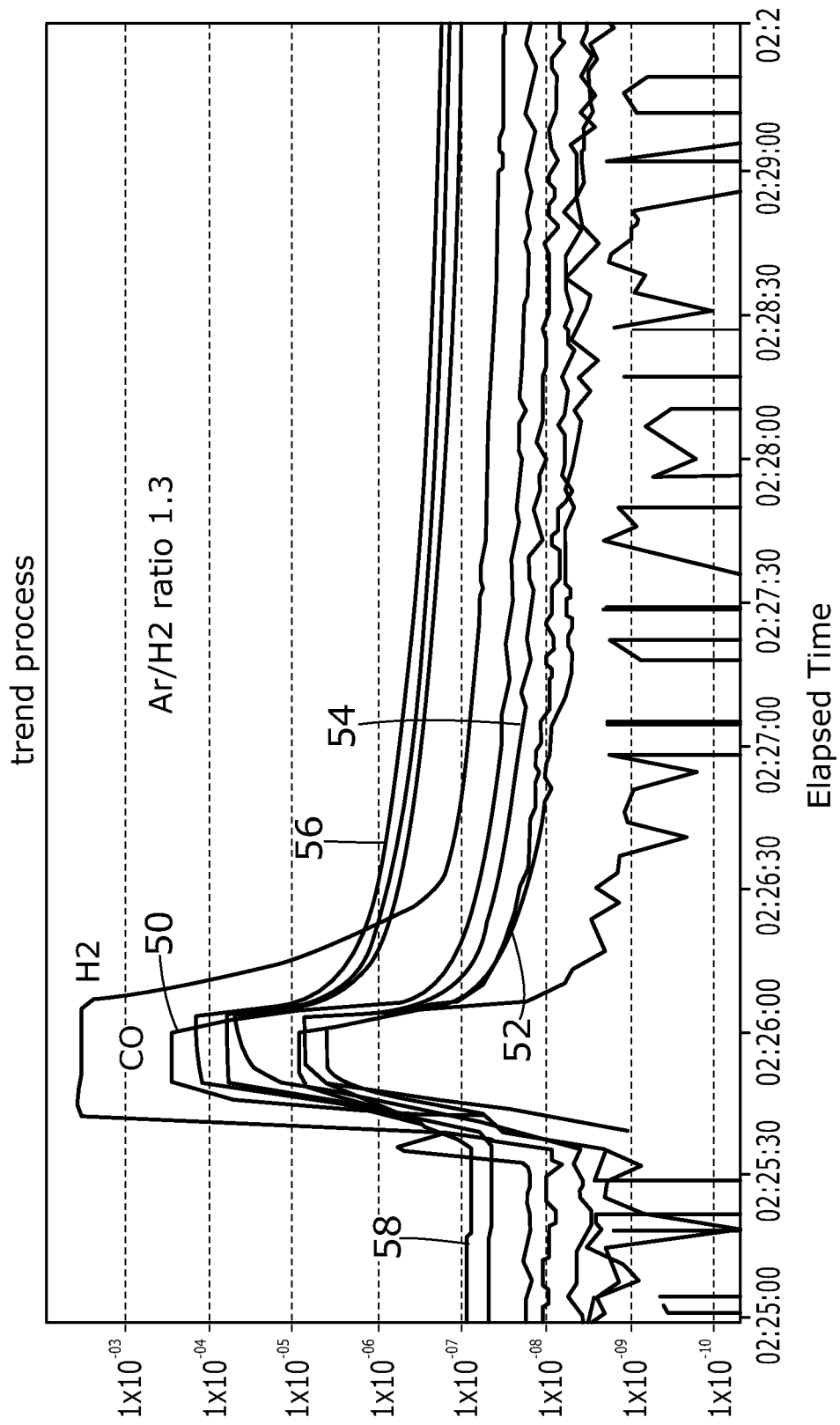
Figure 4  RGA Trace of PI wafer etched using Ar/H2 pre-clean. Total material removed = 200Å

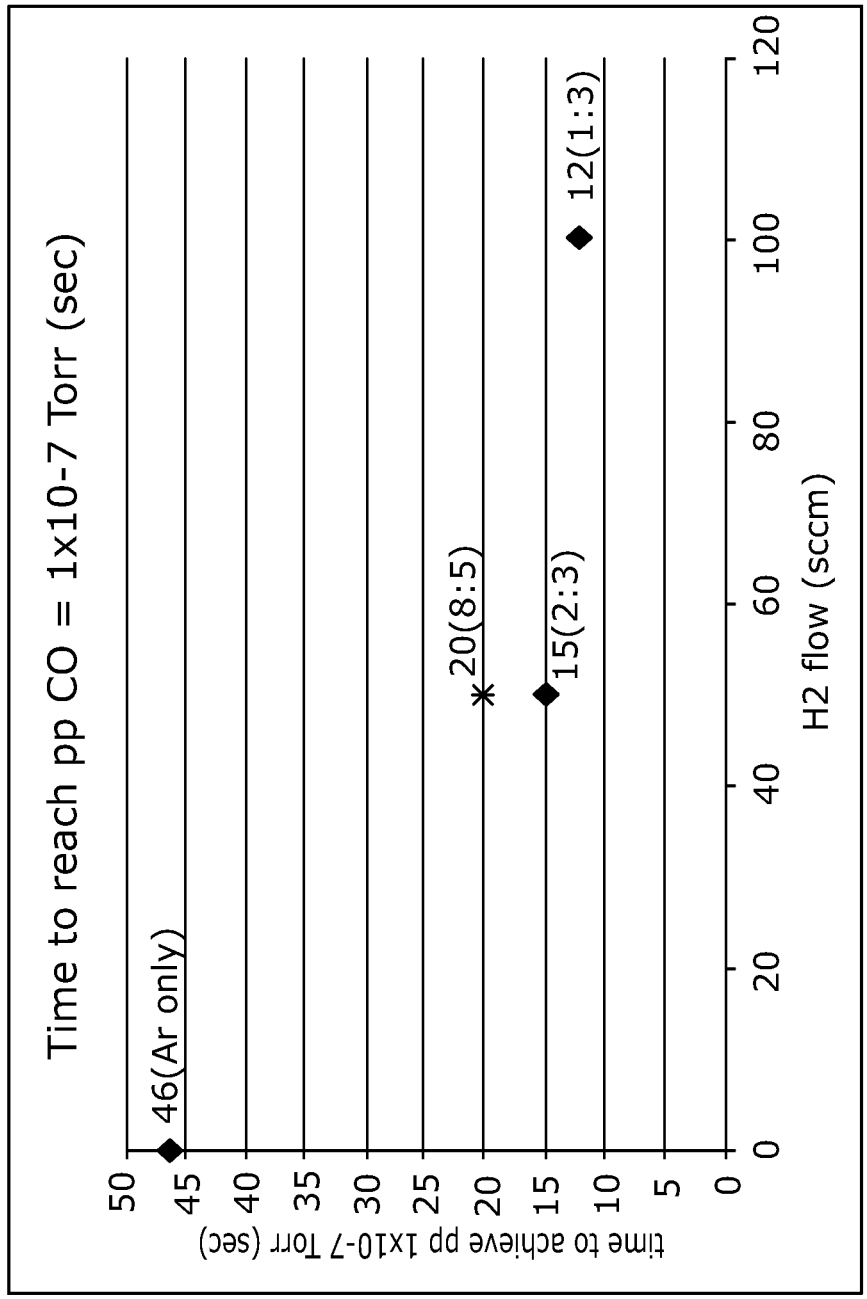
Figure 5  Time to reach partial pressure of $1\times10^{-7}$ Torr for Ar and Ar/H2 sputter etch of 200Å of Al in PI

PRE-CLEANING A SEMICONDUCTOR STRUCTURE

BACKGROUND

This invention relates to a method of pre-cleaning a semiconductor structure, and to associated modular semiconductor process tools.

In the semiconductor industry, it is common practice to sputter etch metal contacts formed beneath an Inter Metal Dielectric (IMD) prior to depositing metal layers or other conductive layers such as titanium, titanium nitride, aluminium and copper in an integrated metallisation tool. The metal contact may be formed from aluminium or another metal. The purpose of the sputter etch is to remove native oxide from the aluminium or other metal surfaces, leaving an atomically clean surface for subsequent depositions. After the required amount of material has been removed from the metal surfaces, the plasma which is part of the sputter etch process is switched off, and the process chamber is evacuated to a pre-determined pressure to avoid contaminating other modules in the integrated process tool. The productivity of the pre-cleaning module is strongly influenced by the amount of time that it takes to recover a sufficiently low pressure in the module prior to removing the wafer from the module and moving it through the transport module into the deposition module. Typically, the sputter etch is an argon sputter etch process performed under high vacuum wherein the wafer surface is bombarded with $Ar^+$ ions.

In some application areas, for example with relatively thick IMDs (typically greater than several microns), an organic dielectric material such as polyimide (PI) is chosen on performance and cost grounds. A non limiting example of such an application area is in Under Bump Metallisation (UBM).

U.S. Pat. No. 6,107,192 discloses a pre-cleaning process prior to metallisation using a variety of plasmas. The plasma pre-cleaning can include chemical reduction of native CuO without sputtering of the Cu sub layer. The IMDs disclosed in U.S. Pat. No. 6,107,192 are low k inorganic materials such as $SiO_2$, SiOF, or low k CDOs (carbon doped oxides). The present invention relates to different processes using organic IMDs wherein physical removal of material is performed. U.S. Pat. No. 4,357,203 discloses the formation of multi layer metallisation systems wherein vias are formed in a polyimide dielectric insulating layer overlaying a layer of aluminium. The vias are formed through an oxygen plasma etch of the polyimide which results in a residual film (not a native oxide) being formed on the exposed, underlying layer of aluminium. The residual film is subsequently removed by a second plasma etching step. The process disclosed in U.S. Pat. No. 4,357,203 uses a second patterned layer of aluminium to form a mask prior to etching of the vias, and the aluminium mask is in place when the second plasma etch is performed. This process is incompatible with the processes addressed by the present invention. In contrast, the present invention has application to modern, commercial semiconductor fabrication technologies wherein prior to a metallisation step, the semiconductor structure is provided having a metal layer below a patterned IMD layer, but with no further layer on top of the IMD layer. It is desirable to provide a pre-cleaning step in order to pre-clean the exposed metal layer. As noted above, it is well-known to perform an Ar sputter etch to achieve this pre-cleaning. However, the present inventors have realised that the Ar sputter process has relatively low selectivity to the materials on the semiconductor wafer surface. Also, the present inventors have realised that the surface area of metal exposed to the pre-clean is in practice considerably less than the surface area of the IMD exposed to the pre-clean, with a result that the majority of material removed from the surface of the semiconductor structure is in fact removed from the surface of the IMD. Furthermore, the present inventors have realised that the sputtered IMD material is potentially a significant source of contamination of the pre-clean process chamber, and also the rest of the process tool should volatile gases exit the pre-cleaning module. Therefore, it is desirable to minimise the amount of unwanted contaminants in the pre-cleaning module following an Ar sputter etch process. The present inventors have further realised that the production of contaminants can be a particular problem when organic dielectric materials such as polyimide are used owing to the nature of the contaminant produced after Ar sputter etching. Examples of problematic contaminants are CO and $CO_2$.

In summary, the present inventors have realised that a specific, but commercially important, combination of process conditions give rise to the specific problems stated above. Accordingly, the present inventors have devised the present invention which, at least in some of its embodiments, addresses the above described problems.

SUMMARY

According to a first aspect of the invention there is provided a method of pre-cleaning a semiconductor structure including the steps of:

i) providing a semiconductor structure having an exposed dielectric layer of an organic dielectric material, wherein the dielectric layer has one or more features formed therein which expose one or more electrically conductive structures to be pre-cleaned, in which the electrically conductive structures each include a metal layer, optionally with a barrier layer formed thereon, and the surface area of the exposed dielectric layer is greater than the surface area of the electrically conductive structures exposed by the dielectric layer; and ii) pre-cleaning the semiconductor structure by performing an $Ar/H_2$ sputter etch to remove material from the exposed electrically conductive structures and to remove organic dielectric material from the exposed dielectric layer wherein step ii) is performed using Ar and $H_2$ present in a partial pressure ratio $Ar:H_2$ of 1.0:1 or less, more preferably less than 0.5:1 and most preferably 0.4:1 or less.

In this way, it is possible to reduce the amount of unwanted contaminants produced during the sputter etch and reduce the pumping time required to achieve a desired pressure, typically corresponding to a high vacuum. A further advantage is that contamination of the semiconductor structure, in particular the metal layer, is reduced.

The skilled reader will appreciate that CDOs are not 'organic dielectric materials' if the bulk oxide is not itself an organic material, ie, doping with carbon does not render an inorganic material organic.

Contaminants such as CO and $CO_2$ may be reduced as a result of practising the present invention.

The term 'metal' is understood to include alloys within its scope. For the avoidance of doubt, the term 'alloy' can encompass combinations of metals, as well as metals having an amount of a non-metal additive. For example, aluminium-silicon alloys are within the scope of the invention. Silicon is typically present as a minor component, for example in the range 0.5-2.5 At %.

Step ii) may be performed using Ar and $H_2$ present in a partial pressure ratio Ar:$H_2$ of 0.1:1 or greater.

It is understood that all possible partial pressure ratio ranges between any two of the figures provided above are within the scope of the invention. For example, the invention includes within its scope Ar:$H_2$ partial pressure ratios in the range 1.0:1-0.1:1, less than 0.5:1-0.1:1, and 0.4:1-0.1:1.

The organic dielectric material may contain carbon and oxygen.

The organic dielectric material may be an organic polymer. Preferably the organic dielectric material is polyimide.

The electrically conductive structures may each have a native oxide layer thereon, and step ii) may include pre-cleaning the semiconductor structure by removing native oxide from the exposed electrically conductive structures.

The ratio of the surface area of the exposed dielectric layer to the surface area of the electrically conductive structures exposed by the dielectric layer may be greater than 25:1, and preferably it is greater than 50:1. In some embodiments, the ratio of the surface area of the exposed dielectric layer to the surface area of the electrically conductive structures exposed by the dielectric layer is greater still, and may be greater than 75:1, or greater than 100:1.

Step ii) may be performed to remove organic dielectric material from the exposed dielectric layer to a depth of at least 10 nm.

The dielectric layer of the organic dielectric material may have a thickness of at least one micron.

The metal layer may be aluminium or copper.

The electrically conductive structures may each consist of a metal layer. Alternatively, the electrically conductive structures may comprise a metal layer having a barrier layer formed thereon. The barrier layer may be a metal layer such as titanium, or a layer of a conductive compound such as TiN. The barrier layer may be present as an ARC (anti-reflective coating) layer, as is well understood by the skilled reader.

The method of the invention may be performed in a pre-cleaning process chamber. The method may include the further step of:

iii) evacuating the pre-cleaning process chamber to a pre-determined pressure or below. Preferably, the pre-determined pressure is $1\times10^{-6}$ Torr. The method may include the further step of:

iv) transferring the semiconductor structure to a further process chamber so that a further process step can be performed, wherein the semiconductor structure is transferred after the pre-determined pressure in the pre-cleaning process chamber is achieved.

The pre-cleaning performed in step ii) may produce CO, and the evacuation of the process chamber to a pre-determined pressure performed in step iii) may include obtaining a partial pressure of CO of $1\times10^{-7}$ Torr or less.

The pre-cleaning performed in step ii) may produce $CO_2$, and the evacuation of the process chamber to a pre-determined pressure performed in step iii) may include obtaining a partial pressure of $CO_2$ of $1\times10^{-7}$ Torr or less.

Typically, the semiconductor structure includes a semiconductor wafer having the electrically conductive structures and the exposed dielectric layer formed thereon.

According to a second aspect in the invention there is provided a modular semiconductor process tool including:

one or more processing modules for providing a semiconductor structure having an exposed dielectric layer of an organic dielectric material, wherein the dielectric layer has one or more features formed therein which expose one or more electrically conductive structures to be pre-cleaned, in which the electrically conductive structures each include a metal layer, optionally with a barrier layer formed thereon, and wherein the surface area of the exposed dielectric layer is greater than the surface area of the electrically conductive structures exposed by the dielectric layer;

a pre-cleaning process chamber;

a further process chamber for performing a further process step on the semiconductor structure;

means for transferring the semiconductor structure from a processing module to the pre-cleaning process chamber; and means for transferring the semiconductor structure from the pre-cleaning process chamber to the further process chamber after pre-cleaning;

in which:

the pre-cleaning process chamber includes sputter etching apparatus for performing an Ar/$H_2$ sputter etch using Ar and $H_2$ present in a partial pressure ratio Ar:$H_2$ of 1.0:1 or less, more preferably less than 0.5:1, and most preferably 0.4:1 or less to remove material from the electrically conductive structures and to remove organic dielectric material from the exposed dielectric layer.

In some embodiments, the further process chamber is a metallisation tool for depositing one or more layers of a metal on the semiconductor structure. A metal layer or other conductive layer such as titanium, titanium nitride, aluminium or copper may be deposited using the metallisation tool.

The means for transferring the semiconductor structure from the pre-cleaning process chamber to the further process chamber may be operable on the detection of a process condition associated with the pre-cleaning process chamber. The process condition may be the attainment of a pre-determined pressure in the pre-cleaning process chamber after pre-cleaning. Typically, the process tool includes a control system for detecting the process condition and controlling operation of the means for transferring the semiconductor structure from the pre-cleaning process chamber to the further process chamber. Typically, the control system monitors other conditions of the process tool and/or process parameters, and controls other operations of the process tool. Transport modules and transport equipment for transferring the semiconductor structure between modules of the process tool are well-known to the skilled reader.

Whilst the invention has been described above, it extends to any inventive combination of the features set out above, or in the following description, drawings or claims.

BRIEF DESCRIPTION OF THE DRAWINGS

Embodiments of methods and apparatus in accordance with the invention will now be described with reference to the accompanying drawings, in which:

FIG. 3 is a Residual Gas Analyser (RGA) trace of a PI/aluminium wafer etched using an Ar sputter etch pre-clean;

FIG. 4 is a RGA trace of a PI/aluminium wafer etched using an Ar/$H_2$ sputter etch pre-clean of the invention; and FIG. 5 shows time to reach a partial CO pressure of $1\times10^{-7}$ Torr for an Ar sputter etch pre-clean and Ar/$H_2$ sputter etch pre-cleans of a wafer having aluminium and PI layers formed thereon.

DETAILED DESCRIPTION OF EMBODIMENTS

Figure 1:
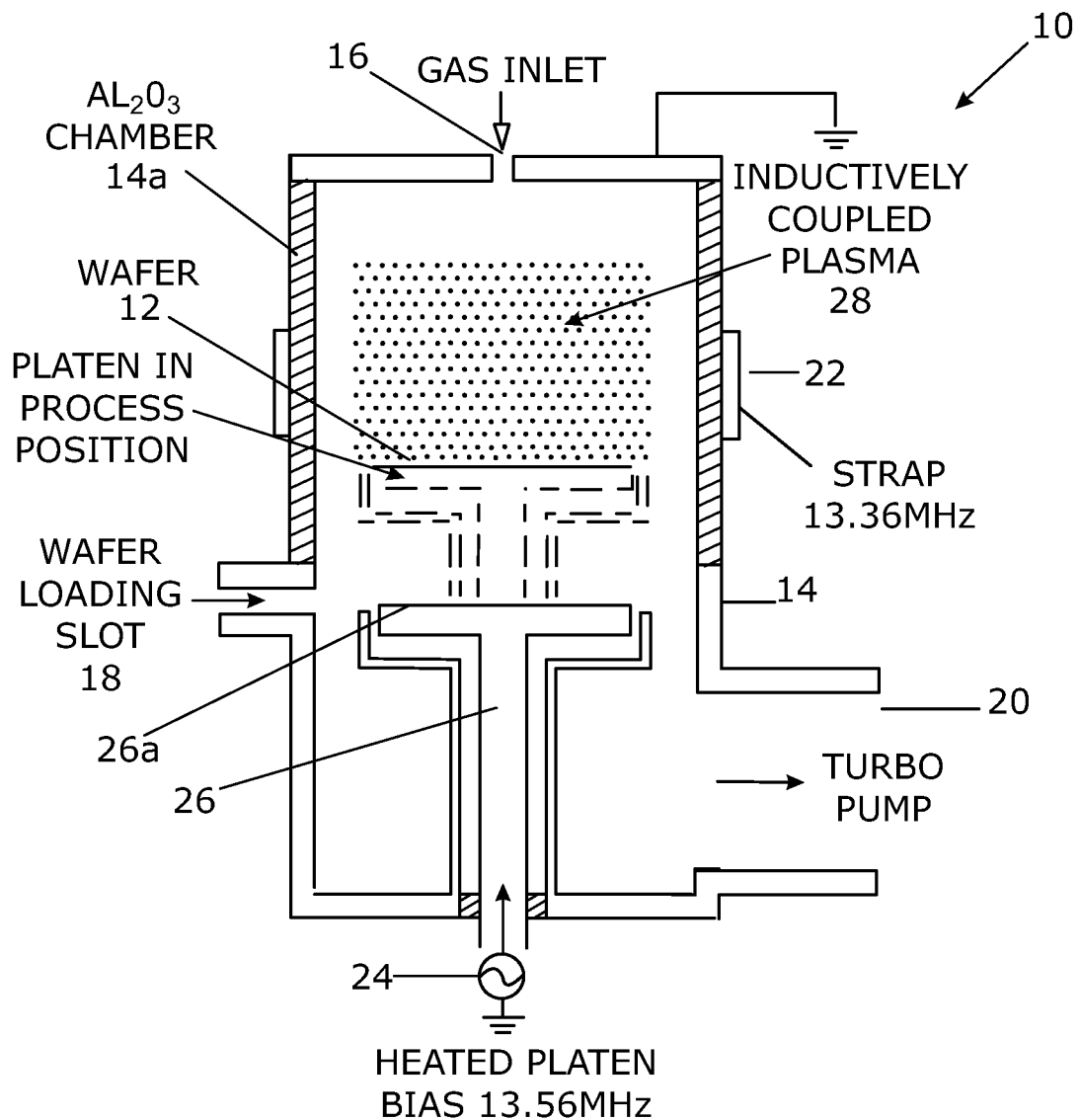
FIG. 1 is a cross-sectional view through a pre-clean module of the invention.

FIG. 1 shows a pre-clean process tool 10 which can comprise a pre-clean module forming part of an integrated semiconductor processing tool (not shown) such as a metallisation tool. When the process tool 10 is provided as a pre-cleaning module in an integrated metallisation tool, the pressure tool 10 is used to clean a semiconductor wafer 12 prior to a metal deposition step by PVD. The process tool 10 comprises a chamber 14 having a gas inlet 16, a wafer loading slot 18, and a pumping port 20 for connection to a suitable pump, such as a turbo pump (not shown). The process tool 10 further comprises plasma production means for producing and sustaining a plasma within the process tool 10. In the embodiment shown in FIG. 1, two RF sources are used to produce the plasma in chamber 14. An upper portion of the chamber 14 has a ceramic wall 14a which can be formed from any suitable ceramic material such as $Al_2O_3$. Disposed around the ceramic wall 14a is a band or strap 22 which forms part of an ICP source. The ICP source and indeed the plasma production device in general is of a type well-known to the skilled reader, and therefore further elements of the ICP source are not shown in FIG. 1. An RF bias source 24 is applied to a platen assembly 26. The platen assembly 26 comprises an upper face 26a on which the wafer 12 is mounted. In use, the RF bias source 24 applies an RF bias to the wafer 12 causing ions from the plasma to be accelerated onto the wafer surface. The RF bias can be of any convenient frequency, and typically 13.56 MHz is used. The platen can be heated in a manner which is well-known to the skilled reader. The chamber 14 is earthed. The platen assembly 26 is shown in both solid and dotted lines in FIG. 1. The solid lines denote the platen assembly in its retracted position adjacent to wafer loading slot 18. In use, a wafer is introduced via the wafer loading slot 18 onto the surface 26a of the platen assembly. The platen assembly 26 is then raised to the position shown by dotted lines in FIG. 1. This is the configuration adopted for pre-cleaning by sputter etching which is achieved by forming a plasma 28 using the plasma production device.

Figure 2:
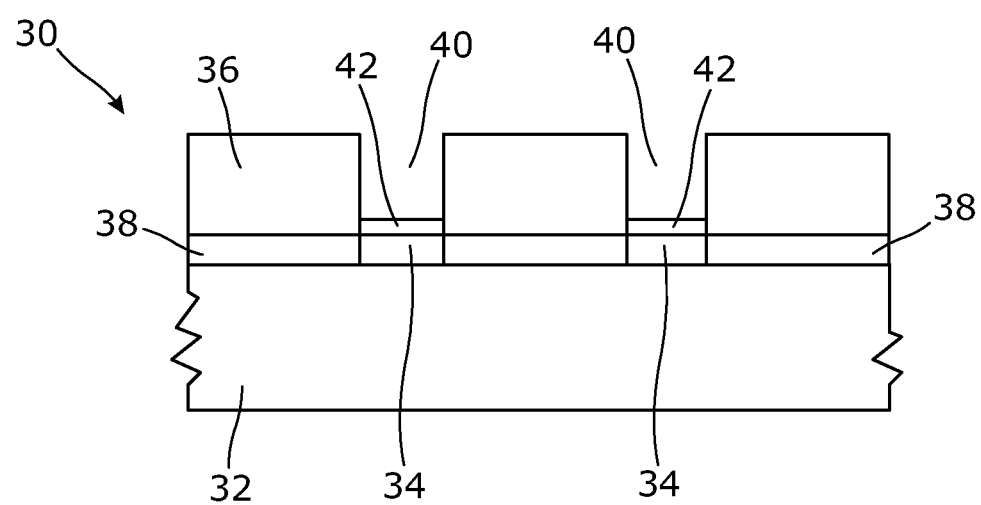
FIG. 2 is a simplified, semi-schematic cross-section through a semiconductor structure to be pre-cleaned.

FIG. 2 shows in semi-schematic form a semiconductor structure, depicted generally at 30, of a general type which can be pre-cleaned in accordance with the invention. For simplicity this schematic representation does not show the interconnect layers below the dielectric 38 and the transistors that are present on the surface of the substrate. The semiconductor structure 30 comprises a semiconductor substrate 32 having aluminium layers 34 formed thereon. A patterned PI layer 36 is formed on layers 38 of a dielectric material. The PI layer 36 has previously been patterned to leave a number of features 40 such as trenches or vias. The features 40 expose the underlying aluminium layers 34. However, as a result of the processing conditions, the semiconductor structure 30 is supplied to the pre-cleaning module in a condition wherein aluminium oxide layers 42 are present over the portions of the aluminium layers 34 which are exposed by the features 40. It is necessary to remove the aluminium oxide layers 42 by pre-cleaning, and the present invention enables this objective to be achieved. It is noted that the semiconductor structure 30 is provided for pre-cleaning with an exposed PI layer 36, i.e., there are no further layers on top of the PI layer 36. In practice, the topography of the semiconductor structure 30 is such that the PI layer 36 forms the majority of the surface area of the semiconductor device which is exposed to the sputter etch during pre-cleaning. It is noted that the layers 38 of a dielectric material may also be formed from PI, but this is not necessarily the case, and the layers 38 may consist of a different dielectric material.

In accordance with the invention, pre-cleaning was performed using a sputter etch process which employs a mixture of argon and hydrogen as process gases. For comparison purposes, and to demonstrate the advantages of the present invention, experiments were also performed using a pure argon sputter etch pre-clean.

A Residual Gas Analyser (RGA) was attached to the process chamber 14 to monitor the gases present during and after various pre-cleaning sputter etches. PI/aluminium semiconductor wafers of the type generally shown in FIG. 2 were subjected to various pre-cleaning steps, and the results are shown in FIGS. 3 to 5. In both FIG. 3 and FIG. 5, the traces corresponding to CO, $CO_2$, $CH_3$, OH and $H_2O$ are denoted by reference numerals 50, 52, 54, 56, and 58, respectively. FIG. 3 shows a typical graphical output from the RGA following an Ar ion pre-clean step of a conventional type. It has been found using RGA analysis that during ion bombardment of PI IMD films, fragments of different mass are ejected from the PI surface. This can be seen in FIG. 3, which shows partial pressures of various mass fragments as a function of time during and after the pre-clean step. The dominant fragments observed are CO and $CO_2$, along with other gas phase hydrocarbon molecules. The levels of these species can be monitored using RGA. CO is a particular problem because it can take a long time to pump away from the chamber, and it is a very reactive species which can promote facile oxidation of a cleaned aluminium or other metal surface to provide a metal oxide layer. This is extremely undesirable, because the purpose of the pre-clean step is to remove metal oxides from the upper surface of the metal layer. The existence of a metal oxide layer is extremely undesirable when the objective is to produce metal to metal contacts to the metal layer, because oxidation of the interface leads to high contact resistance and poor metal to metal adhesion. It is believed that the poor contact resistance which is often observed by prior art processes is the result of residual contaminants, particularly CO, generated by sputtering of PI, which land on the aluminium contacts. More generally, gaseous phase species produced by sputter etching of the PI film can react with the wafer surface, be pumped away, absorb onto the chamber walls, or reside in the chamber as contamination. After sputter etching, the PI surface is also known to be more volatile since the protective 'skin' on the surface is broken, allowing further and on-going contamination of the chamber. It can be seen in FIG. 3 that undesirable contaminants such as CO and $CO_2$ are readily produced following pre-cleaning using a conventional Ar sputter etch, and that these species can take a long time to pump away from the chamber. In the pre-clean resulting in the trace shown in FIG. 3, material was removed from the wafer to a depth of 200 Å (Angstroms).

The present invention physically removes native oxide from metal contacts on semiconductor wafers using an organic dielectric material such as PI as an IMD. The present invention employs an $Ar/H_2$ sputter etch to remove material from the surface of the semiconductor wafer. It has been found that this can reduce the levels of organic contamination within the chamber, and provide productivity benefits, since residence time in the process module can be reduced. FIG. 4 shows an RGA trace for an $Ar/H_2$ plasma sputter etch of a PI and aluminium coated wafer. The typical but non-limiting process conditions for this pre-clean step are Ar flow rate 18 sccm, hydrogen flow rate 1-100 sccm, ICP coil power 500 W, ICP coil frequency 13.56 MHz, platen bias power 1200 W, platen bias frequency 13.56 MHz. Material was removed to a depth of about 200 Å. It can be seen that the use of the argon/hydrogen plasma reduces the levels of CO contamination considerably when compared to the sputter etch using argon only. It can be seen that within 12 seconds, the partial CO pressure drops to $1\times10^{-7}$ Torr, and this is a substantial improvement over the results shown in FIG. 3.

FIG. 5 shows the time taken to achieve a partial pressure of CO of $1\times10^{-7}$ Torr after sputter etch pre-cleaning with argon only, and with various mixtures of argon and hydrogen. The numerals provided directly adjacent the data points in FIG. 5 are the times in seconds to achieve this partial pressure of CO. The numerical values given in parenthesis against data points corresponding to mixtures of argon and hydrogen are the partial pressure ratios of argon to hydrogen. It can be seen from FIG. 5 that using an argon/hydrogen plasma to perform sputter etch pre-cleaning causes the partial pressure of CO to reach the low level of $1\times10^{-7}$ Torr much more quickly than when no hydrogen is present. Consequently, there is a reduced chance of contamination occurring at the sputter cleaned aluminium surface. Furthermore, the productivity of a processing tool which comprises a pre-clean module which utilises the argon/hydrogen sputter etch is improved since the high vacuum conditions necessary before removal of the semiconductor wafer from the pre-clean module can be effected are achieved more quickly. It is noted that this recovery process to achieve a desired high vacuum condition such as the partial pressure of CO of $1\times10^{-7}$ Torr is substantially improved by increasing the relative contribution of hydrogen in the pre-clean process. Note that the data points in FIG. 5 at 0, 50 and 100 sccm of hydrogen all relate to a process in which 18 sccm of argon is used, whereas the 8:5 argon/hydrogen partial pressure ratio data point corresponds to an argon flow of 50 sccm.

Without wishing to be limited by any particular theory or conjecture, a possible explanation for the CO partial pressure traces is a chemical reaction involving CO and $H_2$ which can take place in the gas phase in the presence of heat from the plasma:

$$CO + 2H_2 \rightarrow CH_3OH$$

It is then probable that this molecule will be broken up rapidly into both $CH_3$ (mass 15) and OH (mass 17) fragments by the plasma. This theory agrees well with the RGA trace shown in FIG. 4. The rate of recovery for CO (i.e., the CO removal rate) is far greater than it is for $CH_3$ and OH when the argon/hydrogen pre-cleaning is used. In contrast, as can be seen in FIG. 3, with the argon only pre-clean, the opposite is true, and CO levels take far longer to decrease than $CH_3$ and OH. This suggests that the argon/hydrogen plasma is promoting the formation of $CH_3$ and OH by using up more CO, thereby removing CO which would otherwise be present as residual contamination. By reacting with CO, hydrogen is helping to reduce the contamination of the metal surface by producing species that are less reactive and can be pumped rapidly. In that regard, we note that FIG. 4 shows the partial pressure of $CH_3$ is very low and rapidly achieves a level of $1\times10^{-7}$ Torr or lower. OH tracks the curve for $H_2O$ (mass 18), and takes some additional time to pump away. This can be explained by the presence of an additional reaction, namely the hydrogenation of $CO_2$. This again agrees with the RGA data shown in FIGS. 3 and 4, since the $CO_2$ peak is reduced when an argon/hydrogen plasma is used. The reaction could be as follows:

$$CO_2 + 4H_2 \rightarrow CH_4 + 2H_2O$$

This reaction could explain why levels of mass 16 ($CH_4$) and mass 18 ($H_2O$) are higher when an argon/hydrogen plasma is used in comparison to an argon only plasma. It is noted that higher levels of $H_2O$ are not considered to be a concern, as $H_2O$ is far less reactive and easier to pump (for example with a cryo trap) than CO. Therefore, $H_2O$ is considered to be a much less concerning contaminant than CO. These mechanisms are provided as conjecture only. The experimental results presented herein may be explained by other mechanisms, or the explanation for the results may be a combination of the mechanisms discussed and other mechanisms. For example, it is possible that the presence of ionised hydrogen is resulting in a reaction with CO and/or a reaction with the PI surface itself to lower the levels of CO produced.

The invention is not limited to the specific examples provided above, and the skilled reader will appreciate that many variations are possible. For example, instead of using PI, it is possible to use other organic dielectric materials. The invention provides the teaching that advantageous results can be achieved using an argon/hydrogen sputter etch pre-cleaning. In general, lower partial pressure ratios are preferred when the partial pressure ratio is expressed as the ratio of the partial pressure of argon to the partial pressure of hydrogen. However, the invention is not limited in this regard. By using the invention, it is possible to effectively pre-clean metal surfaces of native oxides whilst lowering the levels of gaseous contaminant species, in particular carbonaceous contaminants such as CO and $CO_2$. This improves the vacuum environment for semiconductor wafers when compared to the industry standard argon only sputter etch pre-cleaning methods. Furthermore, it leads to productivity gains when processing semiconductor wafers in integrated process tools because base pressures can be achieved more quickly.

What is claimed is:

1. A method of pre-cleaning a semiconductor structure including the steps of:
    i) providing a semiconductor structure having a dielectric layer of an organic dielectric material defining one or more features therein, and one or more structures which are exposed by the one or more features and are targeted for pre-cleaning, in which an upper surface of the dielectric layer of an organic dielectric layer is exposed, the one or more structures each include a metal layer that is aluminium or copper, the surface area of the exposed dielectric layer is greater than the surface area of the one or more structures exposed by the one or more features of the dielectric layer, and wherein the organic dielectric material is polyimide;
    ii) sputter etching both a portion of the organic dielectric material from at the exposed upper surface of the dielectric layer and material from the one or more structures with a plasma consisting of a mixture of Ar and $H_2$ until electrically conductive material of each of the one or more structures lies exposed by the one or more features of the dielectric layer, wherein a flow rate of the $H_2$ during the sputter etching is from 1-100 sccm, and wherein a platen bias frequency is 13.56 MHz and a platen bias power reaches 1200 W during the sputter etching;
    iii) evacuating the pre-cleaning process chamber to a pre-determined pressure of $1\times10^{-6}$ Torr or below, in which the sputter etching performed in step ii) produces a partial pressure of CO less than $1\times10^{-3}$ Torr and a partial pressure of $CH_3$ less than $1\times10^{-5}$ Torr, and the evacuation of the process chamber to a pre-determined pressure performed in step iii) includes attaining a partial pressure of CO of $1\times10^{-7}$ Torr or less, and iv) transferring the semiconductor structure to a metal deposition chamber so that a metallization step can be performed, wherein the semiconductor structure is transferred after the pre-determined pressure in the pre-cleaning process chamber is achieved, wherein step ii) comprises generating the plasma consisting of a mixture of Ar and $H_2$ using an inductively coupled plasma (ICP) source, and step ii) is performed with the Ar and $H_2$ at a ratio of partial pressures Ar:$H_2$ of 0.4:1 or less.

2. A method according to claim 1 in which step ii) is performed with the Ar and $H_2$ at a ratio of partial pressures Ar:$H_2$ of 0.1:1 or greater.

3. A method according to claim 1 in which the one or more structures each have a native oxide layer at an uppermost portion thereof, and step ii) includes sputter etching the native oxide layer with only the plasma of the mixture consisting of Ar and $H_2$ such that the native layer is completely removed.

4. A method according to claim 1 in which the ratio of the surface area of the exposed dielectric layer to the total surface area of the metal layer of the one or more structures exposed by the dielectric layer is greater than 25.

5. A method according to claim 1 in which step ii) is performed to remove organic dielectric material from the exposed dielectric layer to a depth of at least 10 nm.

6. A method according to claim 1 in which the dielectric layer of the organic dielectric material has a thickness of at least 1 micron.

7. A method according to claim 1 in which the sputter etching in step ii) is carried out with the plasma of the mixture consisting of Ar and $H_2$ until a surface of the metal layer of each of the one or more structures lies exposed by the one or more features of the dielectric layer.

8. A method according to claim 4 in which the ratio of the surface area of the exposed dielectric layer to the total surface area of the metal layer of the one or more structures exposed by the one or more features of the dielectric layer is greater than 50:1.

9. A method according to claim 1 in which the one or more structures each include a metal layer and a barrier layer thereon.

10. A method of pre-cleaning a semiconductor structure including the steps of:

i) loading into a pre-cleaning process chamber a semiconductor structure having a dielectric layer of an organic dielectric material whose upper surface is exposed and one or more electrically conductive structures to be pre-cleaned, the dielectric layer defining one or more features therein leading to the one or more electrically conductive structures, the electrically conductive structures each including a metal layer that is aluminium or copper, the surface area of the exposed dielectric layer being greater than the surface area of the electrically conductive structures, and wherein the organic dielectric material is polyimide;

ii) within the pre-cleaning process chamber, sputter etching material from atop the one or more electrically conductive structures and sputter etching a portion of the organic dielectric material at the exposed upper surface thereof from the dielectric layer with a plasma consisting of a mixture of Ar and $H_2$, thereby pre-cleaning the semiconductor structure, wherein a flow rate of the $H_2$ during the sputter etching is from 1-100 sccm, and a platen bias frequency is 13.56 MHz and a platen bias power reaches 1200 W during the sputter etching;

iii) evacuating the pre-cleaning process chamber to a pre-determined pressure of $1\times10^{-6}$ Torr or below, in which the sputter etching performed in step ii) produces a partial pressure of CO less than $1\times10^{-3}$ Torr and a partial pressure of $CH_3$ less than $1\times10^{-5}$ Torr, and the evacuation of the process chamber to a pre-determined pressure performed in step iii) includes attaining a partial pressure of CO of $1\times10^{-7}$ Torr or less; and iv) subsequently transferring the semiconductor structure to a further process chamber so that a further process step can be performed, wherein the plasma of a mixture of Ar and $H_2$ is generated using an inductively coupled plasma (ICP) source, the sputter etching of said material from atop the conductive structures and said organic dielectric material with the plasma consisting of a mixture of Ar and $H_2$ is performed with the Ar and $H_2$ at a ratio of partial pressure Ar:$H_2$ of 0.4:1 or less, and the only plasma that is generated in the pre-cleaning process chamber from the time the semiconductor structure is loaded into the pre-cleaning process chamber to the time the semiconductor is transferred from the pre-cleaning process chamber is the plasma of a mixture of Ar and $H_2$.

\* \* \* \* \*